United States Patent
Hsu et al.

(10) Patent No.: US 12,211,455 B2
(45) Date of Patent: Jan. 28, 2025

(54) DISPLAY DEVICE HAVING A PHOTODETECTOR FOR DETECTING AMBIENT LIGHT TO ADJUST BRIGHTNESS OF IMAGE

(71) Applicant: Innolux Corporation, Miaoli County (TW)

(72) Inventors: Yu-Chun Hsu, Miaoli County (TW); Wei-Ming Chu, Miaoli County (TW); Sheng-Nan Fan, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/352,238

(22) Filed: Jul. 13, 2023

(65) Prior Publication Data

US 2024/0062729 A1 Feb. 22, 2024

Related U.S. Application Data

(60) Provisional application No. 63/398,230, filed on Aug. 16, 2022.

(30) Foreign Application Priority Data

Apr. 26, 2023 (CN) .......................... 202310463965.3

(51) Int. Cl.
G09G 3/34 (2006.01)
(52) U.S. Cl.
CPC ... G09G 3/3406 (2013.01); *G09G 2320/0626* (2013.01); *G09G 2320/066* (2013.01); *G09G 2360/144* (2013.01)

(58) Field of Classification Search
CPC ...................................................... G09G 3/3406
USPC ............................................................. 345/55
See application file for complete search history.

(56) References Cited

U.S. PATENT DOCUMENTS

| | | | | |
|---|---|---|---|---|
| 2013/0147777 A1* | 6/2013 | Lau | ........................ | G02B 26/00 315/159 |
| 2014/0213323 A1* | 7/2014 | Holenarsipur | .......... | G06F 1/169 455/566 |

FOREIGN PATENT DOCUMENTS

| | | |
|---|---|---|
| TW | 200745591 | 12/2007 |
| TW | 201243454 | 11/2012 |

\* cited by examiner

*Primary Examiner* — Long D Pham
(74) *Attorney, Agent, or Firm* — JCIPRNET (57) ABSTRACT

A display device, including a display module, a photodetector, a processor, and an optical structure layer, is provided. The display module is used for displaying an image. The photodetector is electrically connected to the display module and is used for detecting brightness of an ambient light and outputting a sensing signal. The processor is electrically connected to the display module and the photodetector, and is used for receiving the sensing signal and outputting a command signal to the display module according to the sensing signal, so that the display module adjusts brightness of the image according to the command signal. The optical structure layer is disposed on the display module. A glossiness of the optical structure layer is between 4 GU and 35 GU, and a reflectivity of specular component included (SCI) of the optical structure layer is between 3% and 6%.

20 Claims, 8 Drawing Sheets

FIG. 7B

DISPLAY DEVICE HAVING A PHOTODETECTOR FOR DETECTING AMBIENT LIGHT TO ADJUST BRIGHTNESS OF IMAGE

CROSS-REFERENCE TO RELATED APPLICATION

This application claims the priority benefits of U.S. provisional application Ser. No. 63/398,230, filed on Aug. 16, 2022, and China application serial no. 202310463965.3, filed on Apr. 26, 2023. The entirety of each of the above-mentioned patent applications is hereby incorporated by reference herein and made a part of this specification.

BACKGROUND

Technical Field

The disclosure relates to a display device, and in particular to a display device capable of detecting the brightness of outside ambient light.

Description of Related Art

When the display device is used outdoors, the ambient light from the outside irradiates the display device to generate reflected light, so that an image displayed by the display device is interfered by the reflected light, causing a decrease in contrast, and resulting in a decrease in display quality.

Furthermore, when the outside ambient light is too bright or too dim, if the brightness of the image of the display device does not change accordingly, the display quality of the display device will be reduced.

SUMMARY

The disclosure provides a display device, which can reduce the effect of the ambient light from the outside on a displayed image, and can adjust the brightness of the image of the display device according to the brightness of the ambient light, thereby improving the display quality of the display device.

A display device provided according to some embodiments of the disclosure includes a display module, a photodetector, a processor, and an optical structure layer. The display module is used for displaying an image. The photodetector is electrically connected to the display module and is used for detecting brightness of an ambient light and outputting a sensing signal. The processor is electrically connected to the display module and the photodetector, and is used for receiving the sensing signal and outputting a command signal to the display module according to the sensing signal, so that the display module adjusts brightness of the image according to the command signal. The optical structure layer is disposed on the display module. A glossiness of the optical structure layer is between 4 GU and 35 GU, and a reflectivity of specular component included (SCI) of the optical structure layer is between 3% and 6%.

A display device provided according to some embodiments of the disclosure includes a display module, a light emitting module, and an optical structure layer. The light emitting module includes multiple independently controllable light emitting regions and is used for emitting light toward the display module. The optical structure layer is disposed on the display module. A glossiness of the optical structure layer is between 4 GU and 35 GU, and a reflectivity of SCI of the optical structure layer is between 3% and 6%.

In order for the features and advantages of the disclosure to be more comprehensible, the following specific embodiments are described in detail in conjunction with the drawings.

BRIEF DESCRIPTION OF THE DRAWINGS

The drawings are included to provide a further understanding of the disclosure, and the drawings are incorporated into the specification and constitute a part of the specification. The drawings illustrate embodiments of the disclosure and serve to explain principles of the disclosure together with the description.

DETAILED DESCRIPTION OF DISCLOSED EMBODIMENTS

Reference will now be made in detail to the exemplary embodiments of the disclosure, examples of which are illustrated in the drawings. Wherever possible, the same reference numerals are used in the drawings and the description to refer to the same or similar parts.

The disclosure can be understood by referring to the following detailed description in conjunction with the drawings. It should be noted that in order to facilitate the understanding of the reader and the brevity of the drawings, multiple drawings in the disclosure only depict a part of an electronic device, and specific elements in the drawings are not drawn according to actual scale. In addition, the number and the size of each element in the drawings are for illustration only and are not intended to limit the scope of the disclosure.

Throughout the specification and the appended claims of the disclosure, certain terms may be used to refer to specific elements. It should be understood by persons skilled in the art that electronic device manufacturers may refer to the same element by different names. The disclosure does not intend to distinguish between elements with the same function but different names. In the following specification and claims, terms such as "including", "containing", and "having" are open-ended terms, so the terms should be interpreted as "containing but not limited to . . . ". Therefore, when the terms "including", "containing", and/or "having" are used in the description of the disclosure, the terms designate the presence of a corresponding feature, region, step, operation, and/or component, but do not exclude the presence of one or more corresponding features, regions, steps, operations, and/or components.

Directional terms such as "upper", "lower", "front", "rear", "left", and "right" mentioned in the disclosure are only directions with reference to the drawings. Therefore, the used directional terms are used to illustrate, but not to limit, the disclosure. In the drawings, each drawing illustrates the general characteristics of a method, a structure, and/or a material used in a specific embodiment. However, the drawings should not be construed to define or limit the scope or nature covered by the embodiments. For example, for clarity, relative sizes, thicknesses, and positions of various film layers, regions, and/or structures may be reduced or enlarged.

When a corresponding component (for example, a film layer or a region) is referred to as being "on another component", the component may be directly on the other component or there may be another component between the two. On the other hand, when a component is referred to as being "directly on another component", there is no component between the two. In addition, when a component is referred to as being "on another component", the two have an upper-lower relationship in the top view direction, and the component may be above or below the other component, and the upper-lower relationship depends on the orientation of the device.

The terms "equal" or "same", "substantially", or "roughly" are generally interpreted as within 20% of a given value or range or interpreted as within 10%, 5%, 3%, 2%, 1%, or 0.5% of the given value or range.

Ordinal numbers such as "first" and "second" used in the specification and the claims are used to modify elements, and the terms do not imply and represent that the element(s) have any previous ordinal numbers, nor do they represent the order of a certain element and another element or the order of a manufacturing method. The use of the ordinal numbers is only to clearly distinguish between an element with a certain name and another element with the same name. The claims and the specification may not use the same terms, whereby a first component in the specification may be a second component in the claims.

It should be noted that in the following embodiments, features in several different embodiments may be replaced, recombined, and mixed to complete other embodiments without departing from the spirit of the disclosure. As long as the features of the various embodiments do not violate the spirit of the invention or conflict with each other, the features may be arbitrarily mixed and matched.

Electrical connection or coupling described in the disclosure may refer to direct connection or indirect connection. In the case of direct connection, terminals of elements on two circuits are directly connected or connected to each other by a conductor segment. In the case of indirect connection, there is a switch, a diode, a capacitor, an inductor, other suitable elements, or a combination of the above elements between the terminals of the elements on the two circuits, but not limited thereto.

In the disclosure, the measurement manner of thickness, length, width, and area may be by adopting an optical microscope, and the thickness may be obtained by measuring a cross-sectional image in an electron microscope, but not limited thereto. In addition, there may be a certain error in any two values or directions for comparison. If a first value is equal to a second value, it implies that there may be an error of about 10% between the first value and the second value. If a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

A display device of the disclosure may be a non-self-luminous display device or a self-luminous display device and may be a double-sided display device. The display device may, for example, include a diode, liquid crystal, a light emitting diode (LED), quantum dot (QD), fluorescence, phosphor, other suitable display media, or a combination of the above. The light emitting diode may, for example, include an organic light emitting diode (OLED), a micro LED, a mini LED, or a quantum dot LED (QDLED), but not limited thereto. It should be noted that the display device may be any permutation and combination of the above, but not limited thereto. In addition, the shape of the display device may be rectangular, circular, polygonal, a shape with curved edges, or other suitable shapes. The display device may have a peripheral system such as a driving system, a control system, and a light source system.

Figure 1A:
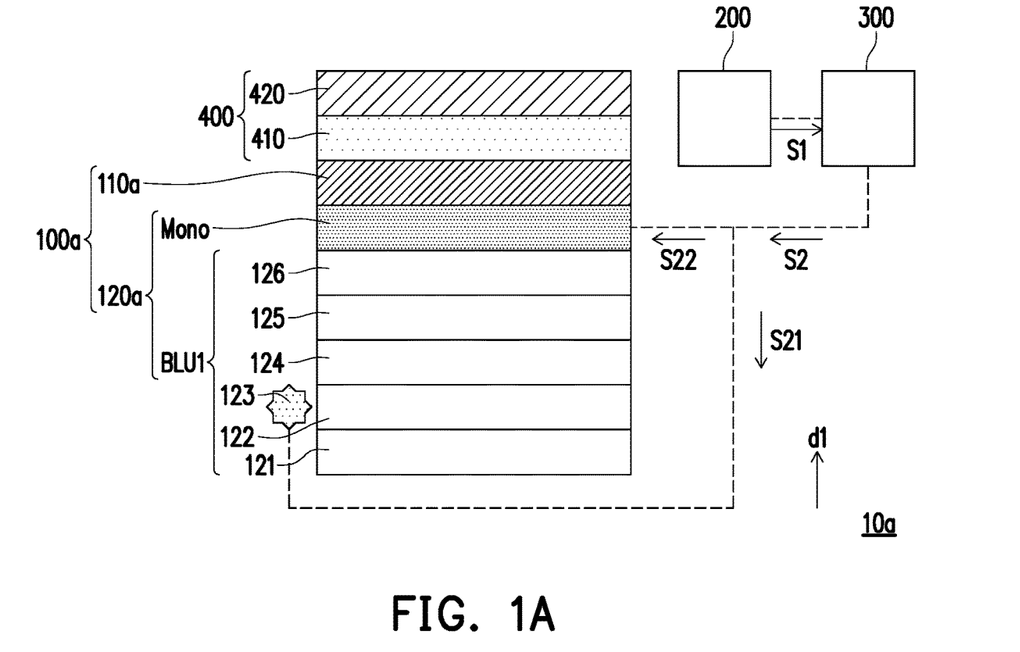
FIG. 1A is a schematic cross-sectional view of a display device according to a first embodiment of the disclosure.
Figure 1B:
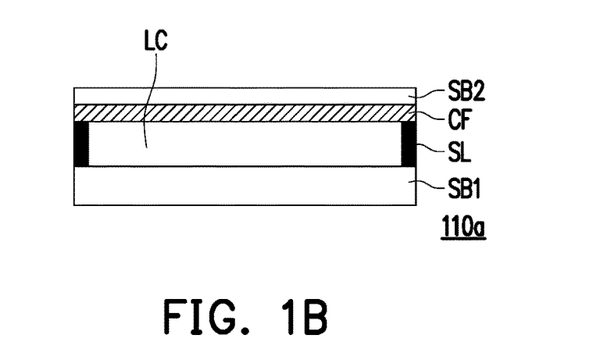
FIG. 1B is a schematic cross-sectional view of a display panel according to an embodiment in the display device of FIG. 1A.
Figure 1C:
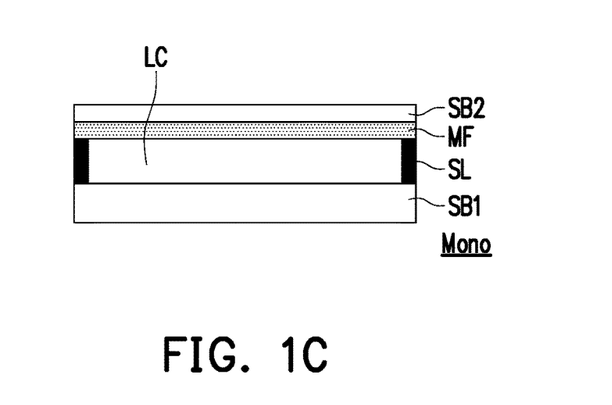
FIG. 1C is a schematic cross-sectional view of a display panel according to another embodiment in the display device of FIG. 1A.

FIG. 1A is a schematic cross-sectional view of a display device according to a first embodiment of the disclosure, FIG. 1B is a schematic cross-sectional view of a display panel according to an embodiment in the display device of FIG. 1A, and FIG. 1C is a schematic cross-sectional view of a display panel according to another embodiment in the display device of FIG. 1A.

Please refer to FIG. 1A. A display device 10a of the embodiment includes a display module 100a, a photodetector 200, a processor 300, and an optical structure layer 400, but the disclosure is not limited thereto. The display device 10a of the embodiment may be, for example, applied to a digital gallery, a mobile phone, a tablet computer, a public information display, and/or other electronic devices that may be used outdoors or in environments with high-intensity ambient light.

The display module 100a includes, for example, a display panel 110a and a light emitting module 120a, and is used for displaying an image. In some embodiments, the display module 100a may include a liquid crystal display module, an organic light emitting diode display module, a micro light emitting diode display module, or a mini light emitting diode display module, but the disclosure is not limited thereto.

In the embodiment, the display panel 110a is disposed between the optical structure layer 400 and the light emitting module 120a, and includes, for example, a liquid crystal display panel, but the disclosure is not limited thereto. In some embodiments, as shown in FIG. 1B, the display panel 110a may include a substrate SB1, an opposing substrate SB2, an element layer (not shown), a liquid crystal layer LC, a color filter layer CF, and a sealant SL. The substrate SB1 and the opposing substrate SB2 may, for example, include a flexible substrate or an inflexible substrate, wherein the materials of the substrate SB1 and the opposing substrate SB2 may include glass, plastic, or a combination thereof. For example, the materials of the substrate SB1 and the opposing substrate SB2 may include quartz, sapphire, polymethyl methacrylate (PMMA), polycarbonate (PC), polyimide (PI), polyethylene terephthalate (PET), other suitable materials, or a combination of the above materials, but the disclosure is not limited thereto. The element layer of the display panel 110a is, for example, disposed on the substrate SB1 and may, for example, include a circuit structure to drive the liquid crystal layer LC. For example, the element layer of the display panel 110 may include multiple scan lines, multiple data lines, an insulating layer, a capacitor, multiple transistors, and/or multiple electrodes, etc., but the disclosure is not limited thereto. In some embodiments, the element layer of the display panel 110a may include multiple circuits but not transistors. The liquid crystal layer LC may be, for example, disposed on the element layer. In some embodiments, the liquid crystal layer LC may include liquid crystal molecules that may be rotated or switched by a vertical electric field or liquid crystal molecules that may be rotated or switched by a horizontal electric field, but the disclosure is not limited thereto. The color filter layer CF is, for example, disposed between the liquid crystal layer LC and the opposing substrate SB2, wherein the color filter layer CF may filter out various suitable color light (for example, red light, green light, blue light, white light, and other color light), so that the display panel 110a may display the image including the color light, but the disclosure is not limited thereto. The sealant SL is, for example, disposed between the substrate SB1 and the opposing substrate SB2, and may, for example, surround the liquid crystal layer LC to reduce the possibility of the liquid crystal layer LC flowing out.

The light emitting module 120a is, for example, used for providing light to the display panel 110a. In the embodiment, the light emitting module 120a includes a monochrome liquid crystal panel Mono and a backlight unit BLU1, and may adjust the brightness of the light according to a command signal S2 transmitted by the processor 300. Therefore, in the embodiment, the light emitting module 120a includes multiple independently controllable light emitting regions, as described in detail below.

The monochrome liquid crystal panel Mono is, for example, disposed between the backlight unit BLU1 and the display panel 110a. In some embodiments, as shown in FIG. 1C, the monochrome liquid crystal panel Mono may include the substrate SB1, the opposing substrate SB2, the element layer (not shown), the liquid crystal layer LC, a monochrome filter layer MF, and the sealant SL, wherein reference may be made to the introduction of the display panel 110a of the foregoing embodiment for the materials of the substrate SB1, the opposing substrate SB2, the element layer (not shown), the liquid crystal layer LC, and the sealant SL, and the configurational relationships thereof, which will not be repeated here. The main difference between the monochrome liquid crystal panel Mono and the display panel 110a is that the monochrome liquid crystal panel Mono includes the monochrome filter layer MF, while the display panel 110a includes the color filter layer CF. Through enabling the light emitting module 120a to include a combination of the monochrome liquid crystal panel Mono and the display panel 110a, the monochrome filter layer MF may be used for adjusting a grayscale of a specific sub-pixel (not shown) of the display panel 110a. In the embodiment, the monochrome liquid crystal panel Mono may adjust the grayscale of the specific sub-pixel (not shown) of the display panel 110 through the command signal S2 transmitted from the processor 300, so as to improve the contrast of the image displayed by the display module 100a.

The backlight unit BLU1 includes, for example, a reflection sheet 121, a light guide plate 122, a light source 123, a lower diffusion sheet 124, an upper diffusion sheet 125, and a brightness enhancement film 126, wherein the reflection sheet 121, the light guide plate 122, the lower diffusion sheet 124, the upper diffusion sheet 125, and the brightness enhancement film 126 are laminated in a normal direction n of the display panel 110 in this order. In the embodiment, the backlight unit BLU1 may, for example, receive the command signal S2 transmitted from the processor 300, so that the backlight unit BLU1 may adjust the brightness of light emitted by the light source 123 depending on the intensity of the ambient light, so as to improve the quality of the image displayed by the display panel 110a, so that the user can have a good perception when viewing the display device 10a of the embodiment.

The reflection sheet 121 has, for example, high reflectivity and may be, for example, used for reflecting light passing through the light guide plate 122 back to the light guide plate 122, so as to increase the usage efficiency of light in the display panel 110a.

The light guide plate 122 has, for example, high light transmittance and may be, for example, used for guiding the travelling direction of light. In detail, the light guide plate 122 may provide the light emitted by the light source 123 to the display panel 110a.

The light source 123 is, for example, used for providing light to the light guide plate 122. The light provided by the light source 123 may be, for example, transmitted in the light guide plate 122 to be provided to the display panel 110. In the embodiment, the light source 123 is adjacently disposed on a side of the light guide plate 122. That is, the light source 123 is a side-type light source, so that the thickness of the display device 10a may be reduced. In some embodiments, the light source 123 may include multiple light emitting diodes, wherein a driving manner of the light emitting diodes may include passive matrix addressing, active matrix addressing, or control by an integrated circuit, but the disclosure is not limited thereto.

The lower diffusion sheet 124 is, for example, used for diffusing light from the light guide plate 122 and has, for example, high light transmittance, and the upper diffusion sheet 125 is, for example, used for further diffusing light from the upper light guide plate 122 and is, for example, used for concealing. In the embodiment, the upper diffusion sheet 125 is directly disposed on the lower diffusion sheet 124. Specifically, there is no optical film layer between the upper diffusion sheet 125 and the lower diffusion sheet 124, but there may be an air gap or an adhesive layer for adhering the two between the upper diffusion sheet 125 and the lower diffusion sheet 124. Based on this, the display panel 110 may receive uniform light from the lower diffusion sheet 124 and the upper diffusion sheet 125, so that the display device 10a may have a relatively wide viewing angle.

In the embodiment, the brightness enhancement film 126 includes a dual brightness enhancement film (DBEF), which may be, for example, used for improving the utilization efficiency of the light from the light guide plate 122.

Figure 1D:
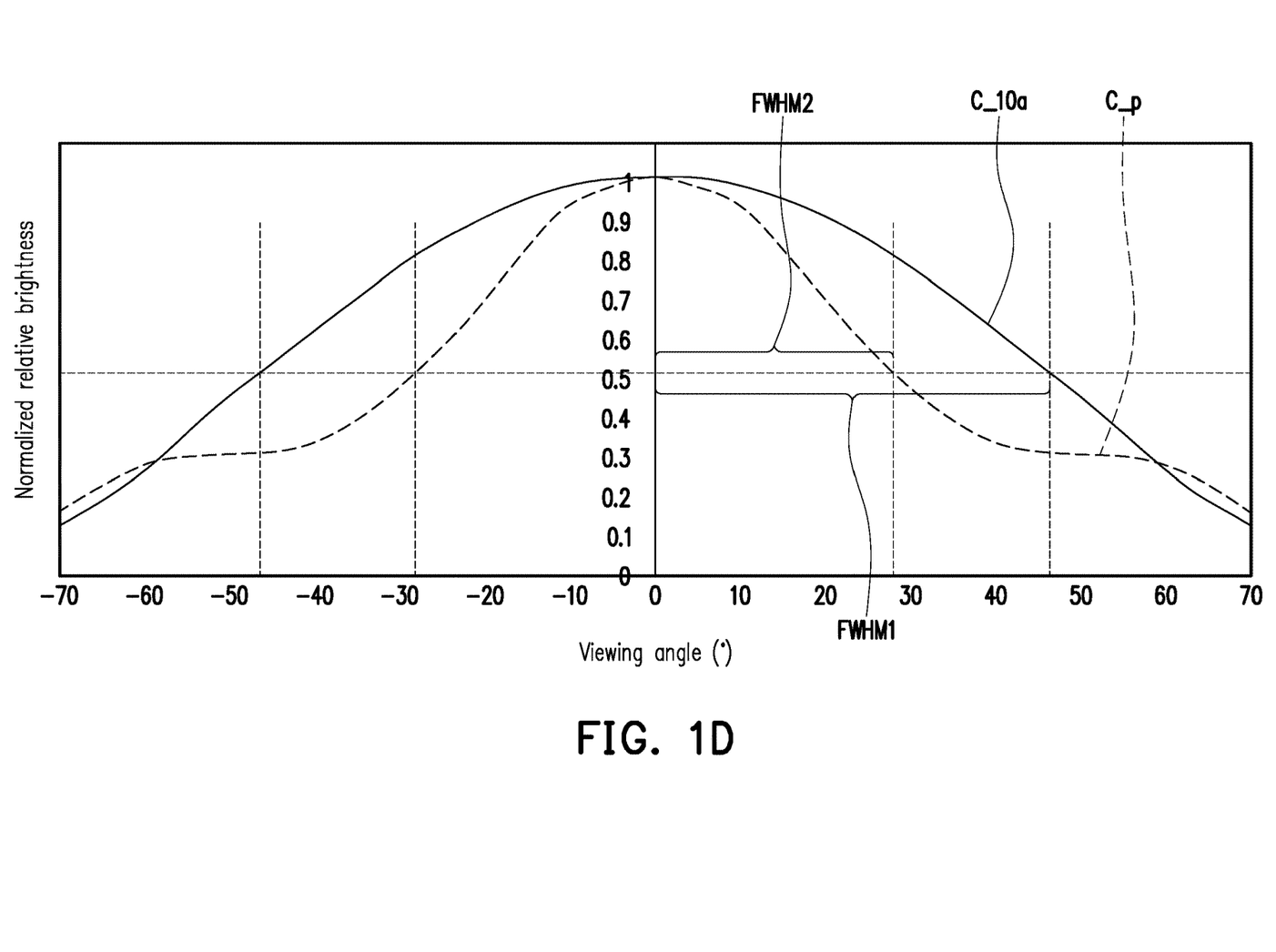
FIG. 1D is a graph of a relationship between brightness and viewing angle of the display device according to FIG. 1A and a conventional display device.

FIG. 1D is a graph of a relationship between brightness and viewing angle of the display device according to FIG. 1A and a conventional display device.

As shown in FIG. 1D, which shows a relationship curve C_10a of the brightness against the viewing angle of the light emitting module of the display device 10a of the embodiment and a relationship curve C_p of the brightness against the viewing angle of a light emitting module in the conventional display device, wherein compositions of the light emitting modules included in the display device 10a and the conventional display device are shown in Table 1 below.

TABLE 1

| | Display panel 110a of display device 10a | Display panel in conventional display device |
|---|---|---|
| Composition of lamination of light emitting module | Upper diffusion sheet 125 — Lower diffusion sheet 124 Light guide plate 122 Reflection sheet 121 | Upper diffusion sheet X-BEF Lower diffusion sheet Light guide plate Reflection sheet |
| Difference between angle of viewing angle corresponding to half of light intensity provided by light emitting module and angle of center viewing angle | 45° | 25° |

Please refer to FIG. 1D and Table 1. The relationship curve C_10a provided by the light emitting module 120a in the display device 10a of the embodiment has a relatively wide full width at half maximum FWHM1, wherein the difference between the angle of the viewing angle corresponding to half of the light intensity provided by the light emitting module 120a and the angle of the center viewing angle is greater than 40 degrees, that is, light provided by the light emitting module 120a has a relatively wide and flat distribution, so that the brightness of the display panel 110a of the display device 10a of the embodiment is evenly distributed at each viewing angle, and the display panel 110a can still have relatively high brightness at a wider viewing angle. In contrast, since the backlight module in the conventional display device includes the crossed brightness enhancement film disposed between the upper diffusion sheet and the lower diffusion sheet, light provided by the backlight module is concentrated at the center viewing angle, so that the relationship curve C_p has a relatively narrow full width at half maximum FWHM2, that is, the brightness of the display panel in the conventional display device rapidly decays with the increase in the viewing angle such that the user does not have a good perception when viewing the conventional display device.

The photodetector 200 is, for example, electrically connected to the display module 100a and is used for detecting the brightness of the ambient light and outputting a sensing signal. In detail, the photodetector 200 may be, for example, electrically connected to the display module 100a through the processor 300, and may detect the brightness of the ambient light and output a sensing signal S1 to the processor 300. In some embodiments, the photodetector 200 may include multiple photosensitive elements (not shown) and switch elements (not shown), wherein the photosensitive elements may receive light and generate the sensing signal S1 (that is, carriers, such as electrons and/or holes). When the switch element is turned on, the sensing signal S1 is transmitted to the processor 300 through the switch element, thereby implementing the function of light detection.

The processor 300 is, for example, electrically connected to the display module 100a and the photodetector 200. In some embodiments, the processor 300 may include a central processor, a controller, other suitable processing circuits, or a combination thereof, but the disclosure is not limited thereto. In the embodiment, the processor 300 may be used for receiving the sensing signal S1 from the photodetector 200 and outputting the command signal S2 to the display module 100a according to the sensing signal S1, so that the display module 100a may adjust the brightness of the displayed image according to the command signal S2. For example, when the outside ambient light is relatively bright, the processor 300 may output the command signal S2 to the display module 100a after receiving the sensing signal S1 from the photodetector 200, so that the backlight module BLU1 in the display module 100a correspondingly increases the brightness of emitted light. In contrast, when the outside ambient light is relatively dim, the processor 300 may output the command signal S2 to the display module 100a after receiving the sensing signal S1 from the photodetector 200, so that the backlight module BLU1 in the display module 100a correspondingly decreases the brightness of the emitted light.

Based on this, in the embodiment, the processor 300 may confirm the brightness of the current ambient light through receiving the sensing signal S1 from the photodetector 200, so as to send the specific command signal S2 to the display module 100a. For example, the processor 300 may send the command signal S21 to the backlight unit BLU1 in the light emitting module 120a, so that the light emitting module 120a may adjust the brightness of the light source 123 according to the brightness of the ambient light. In addition, the processor 300 may also send the command signal S22 to the monochrome liquid crystal panel Mono in the light emitting module 120a, so that the light emitting module 120a may adjust the grayscale of the specific sub-pixel (not shown) according to the brightness of the ambient light, so that the user can have a good perception when viewing the display device 10a of the embodiment.

The optical structure layer 400 is, for example, disposed on the display module 100a. In some embodiments, the optical structure layer 400 may, for example, include an anti-glare layer 410 and an anti-reflection layer 420. In some embodiments, the anti-glare layer 310 may, for example, have the forms of an anti-glare layer 410a, an anti-glare layer 410b, an anti-glare layer 410c, and an anti-glare layer 410d respectively shown in FIG. 1E to FIG. 1H below, but the disclosure is not limited thereto.

Figure 1E:
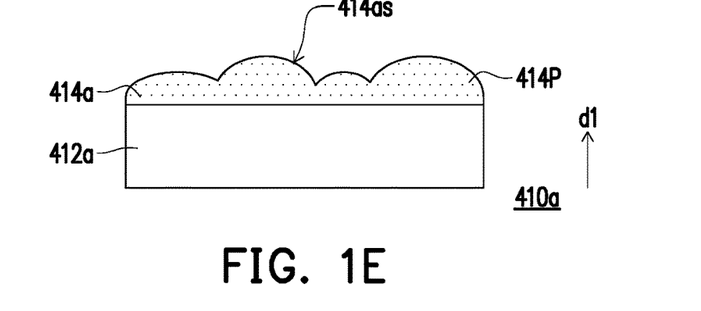
FIG. 1E is a schematic partial cross-sectional view of an anti-glare layer in an optical structure layer according to an embodiment of FIG. 1A.

FIG. 1E is a schematic partial cross-sectional view of an anti-glare layer in an optical structure layer according to an embodiment of FIG. 1A.

In some embodiments, as shown in FIG. 1E, the anti-glare layer 410a includes a cover plate 412a and an anti-glare film 414a.

The cover plate 412a is, for example, disposed on the display panel 110, and is located between the display panel 110 and the anti-glare film 414a in a first direction dl (direction of light emission of the display panel 110a). The cover plate 412a may, for example, include effects such as dustproof, anti-scratch, and water-proof intrusion to reduce the effect of the external environment on components inside the display panel 110a, and may, for example, have light transmittance. In some embodiments, the material of the cover plate 412a may include glass, wherein the type or the composition of the glass is not particularly limited, and the glass may, for example, be aluminosilicate glass, lithium aluminosilicate glass, soda lime silicate glass, aluminosilicate glass, quartz glass, or other glass with light transmittance, but the disclosure is not limited thereto. In some other embodiments, the material of the cover plate 412a may include an organic material, such as resin, acrylic, or other suitable organic materials.

The anti-glare film 414a is, for example, disposed on the cover plate 412a, and has, for example, a rough surface 414as. Based on this, the surface of the anti-glare film 414a may be, for example, used for increasing the diffusion of the ambient light from the outside and/or reducing the direct reflection of the ambient light from the outside, so that the anti-glare film 414a has anti-glare properties to improve the comfort of the user when viewing the display module 100a of the display device 10a. In some embodiments, the anti-glare film 414a may be formed through performing a coating process on the cover plate 412a (support body) to coat a curable composition, and then performing a curing process on the curable composition, wherein the coating process may include a spray coating process, and the curing process may include a photocuring process or a thermal curing process, but the disclosure is not limited thereto. In some other embodiments, the anti-glare film 414a may be formed through forming an anti-glare material layer (not shown) on the cover plate 412a, and then performing a transfer printing process using a mold (not shown) having a surface with a concave-convex structure.

In the embodiment, the anti-glare film 414a includes a curable resin (for example, a photocurable resin or a thermal curable resin) and multiple silica particles. The silica particles included in the anti-glare film 414a may, for example, form multiple irregular protrusions 414P on the surface 414as of the anti-glare film 414a away from the cover plate 412a, so that the anti-glare film 414a has anti-glare properties. In some embodiments, the arithmetic mean deviation (Ra) of the contour of the surface 414as of the anti-glare film 414a is between 0.1 μm and 0.5 μm (0.1 μm≤Ra≤0.5 μm), and the mean width (Rsm) of the contour of the surface 414as of the anti-glare film 414a is between 5 μm and 20 μm (5 μm≤Rsm≤50 μm). The arithmetic mean deviation (Ra) and the mean width (Rsm) of the contour of the surface 414as of the anti-glare film 414a may be, for example, obtained by measuring using KLA-Tencor P-6, but the disclosure is not limited thereto.

Figure 1F:
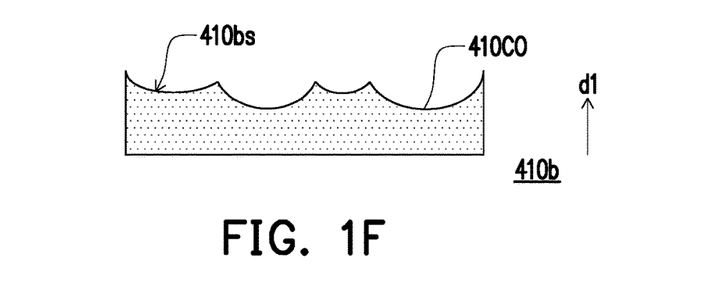
FIG. 1F is a schematic partial cross-sectional view of an anti-glare layer in an optical structure layer according to another embodiment of FIG. 1A.

FIG. 1F is a schematic partial cross-sectional view of an anti-glare layer in an optical structure layer according to another embodiment of FIG. 1A. It should be noted that FIG. 1F may continue to use the reference numerals and some content of the embodiment of FIG. 1E, wherein the same or similar reference numerals are adopted to indicate the same or similar elements, and the description of the same technical content is omitted.

In some embodiments, as shown in FIG. 1F, the anti-glare layer 410b is a cover plate, and the cover plate has a rough surface on a surface 410bs away from the display panel 110a.

In detail, the material included in the anti-glare layer 410b may, for example, be the same as or similar to the material included in the cover plate 412a of the foregoing embodiment. In some embodiments, the rough surface of the anti-glare layer 410b may be formed through performing an etching process on an anti-glare material layer (not shown), wherein hydrofluoric acid may be used for etching during the etching process, but the disclosure is not limited thereto. Based on this, the surface 410bs of the anti-glare layer 410b may, for example, have multiple concave surfaces 410CO, and the surface 410bs of the anti-glare layer 410b may also be, for example, used for increasing the diffusion of the ambient light from the outside and/or reducing the direct reflection of the ambient light from the outside, so that the anti-glare layer 410b has anti-glare properties to improve the comfort of the user when viewing the display module 100a of the display device 10a. In some embodiments, the arithmetic mean deviation (Ra) of the contour of the surface 410bs of the anti-glare layer 410b is between 0.1 μm and 0.5 μm (0.1 μm≤Ra≤0.5 μm), and the mean width (Rsm) of the contour of the surface 410bs of the anti-glare layer 410b is between 5 μm and 20 μm (5 μm≤Rsm≤50 μm). The measurement manner of the arithmetic mean deviation (Ra) and the mean width (Rsm) of the contour of the surface 410bs of the anti-glare layer 410b may, for example, be the same as or similar to the measurement manner of the arithmetic mean deviation (Ra) and the mean width (Rsm) of the contour of the surface 414as of the anti-glare layer 414a, which will not be repeated here.

Figure 1G:
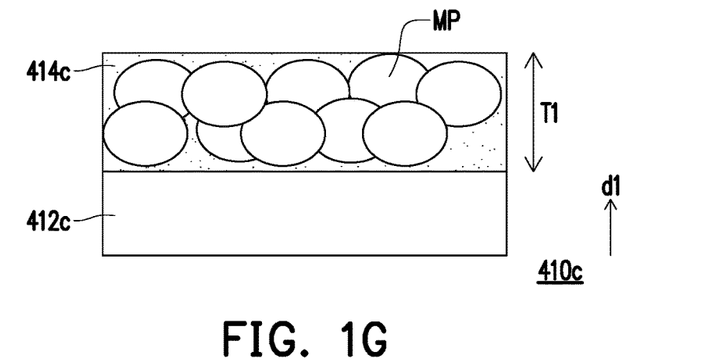
FIG. 1G is a schematic partial cross-sectional view of an anti-glare layer in an optical structure layer according to yet another embodiment of FIG. 1A.

FIG. 1G is a schematic partial cross-sectional view of an anti-glare layer in an optical structure layer according to yet another embodiment of FIG. 1A. It should be noted that FIG. 1G may continue to use the reference numerals and some content of the embodiment of FIG. 1F, wherein the same or similar reference numerals are adopted to indicate the same or similar elements, and the description of the same technical content is omitted.

In some embodiments, as shown in FIG. 1G, the anti-glare layer 410c includes a substrate 412c and a hard coat layer 414c.

In detail, in the embodiment, the substrate 412c is disposed on the display panel 110a and is located between the display panel 110a and the hard coat layer 414c in the first direction dl (direction of light emission of the display panel 110a). The substrate 412c has, for example, light transmittance and/or adhesiveness with the hard coat layer 414c and the display panel 110a. In some embodiments, the material of the substrate 412c may include an organic material, an inorganic material, or a combination thereof, but the disclosure is not limited thereto. In some other embodiments, the substrate 412c may include a polarizing plate, wherein the substrate 412c may include a structure of a lower protective film (not shown), a polarizing sheet (not shown), and an upper protective film (not shown) laminated in the first direction dl in this order. The hard coat layer 414c is, for example, disposed on the substrate 412c, and the hard coat layer 414c includes, for example, a curable resin (for example, a photocurable resin or a thermal curable resin) and multiple silica particles MP. In some embodiments, the hard coat layer 414c may be formed through performing a coating process on the substrate 412c to coat a curable composition, and then performing a curing process on the curable composition, wherein the coating process may include a spray coating process, and the curing process may include a photocuring process or a thermal curing process, but the disclosure is not limited thereto. The silica particles MP included in the hard coat layer 414c may be, for example, used for increasing the diffusion of the ambient light from the outside and/or reducing the direct reflection of the ambient light from the outside, so that the anti-glare layer 410c has anti-glare properties. In some other embodiments, the silica particles MP included in the hard coat layer 414c may form multiple irregular protrusions (not shown) on a surface of the coating layer 414c away from the substrate 412c, but the disclosure is not limited thereto. In some embodiments, a thickness T1 of the hard coat layer 414c is between 1 μm and 3 μm (1 μm≤T1≤3 μm), which can enable the hard coat layer 414c to have suitable hardness and/or strength, but the disclosure is not limited thereto.

Figure 1H:
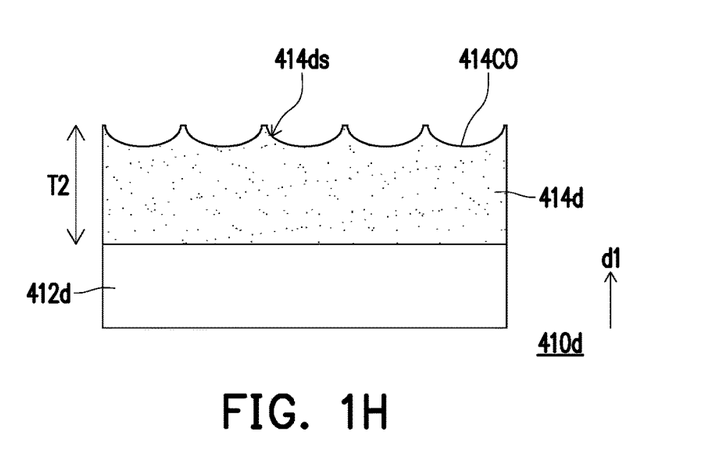
FIG. 1H is a schematic partial cross-sectional view of an anti-glare layer in an optical structure layer according to still another embodiment of FIG. 1A.

FIG. 1H is a schematic partial cross-sectional view of an anti-glare layer in an optical structure layer according to still another embodiment of FIG. 1A. It should be noted that FIG. 1H may continue to use the reference numerals and some content of the embodiment of FIG. 1G, wherein the same or similar reference numerals are adopted to indicate the same or similar elements, and the description of the same technical content is omitted.

In some embodiments, as shown in FIG. 1H, the anti-glare layer 410d includes a substrate 412d and a hard coat layer 414d.

The hard coat layer 414d is disposed on the substrate 412d, and the hard coat layer 414d has a rough surface on a surface 414ds away from the substrate 412c. In some embodiments, the rough surface of the hard coat layer 414d may be formed through performing an etching process on a hard coat material layer (not shown), wherein hydrofluoric acid may be used for etching during the etching process, but the disclosure is not limited thereto. Based on this, the surface 414ds of the hard coat layer 414d may, for example, have multiple concave surfaces 414CO, and the surface 414ds of the hard coat layer 414d may also be, for example, used for increasing the diffusion of the ambient light from the outside and/or reducing the direct reflection of the ambient light from the outside, so that the hard coat layer 414d has anti-glare properties to improve the comfort of the user when viewing the display module 100a of the display device 10a. In some embodiments, the arithmetic mean deviation (Ra) of the contour of the surface 414ds of the hard coat layer 414d is between 0.1 μm and 0.5 μm (0.1 μm≤Ra≤0.5 μm), and the mean width (Rsm) of the contour of the surface 414ds of the hard coat layer 414d is between 5 μm and 20 μm (5 μm≤Rsm≤50 μm). The measurement manner of the arithmetic mean deviation (Ra) and the mean width (Rsm) of the contour of the surface 414ds of the hard coat layer 414d may be, for example, the same as or similar to the measurement manner of the arithmetic mean deviation (Ra) and the mean width (Rsm) of the contour of the surface 414as of the anti-glare film 414a of the foregoing embodiment, which will not be repeated here. In some embodiments, a thickness T2 of the hard coat layer 414d is between 1 μm and 3 μm (1 μm≤T2≤3 μm), which can enable the hard coat layer 414d to have suitable hardness and/or strength, but the disclosure is not limited thereto.

Figure 1I:
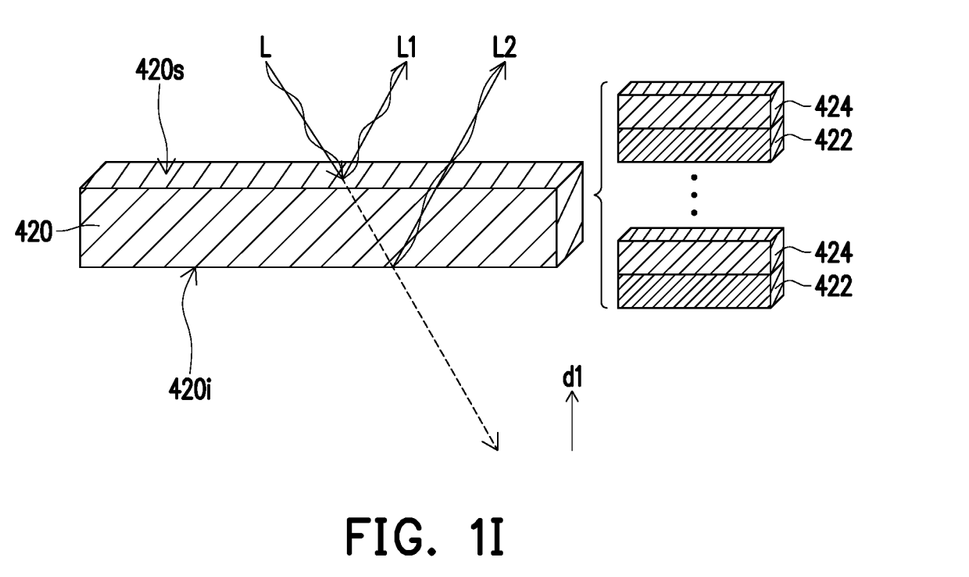
FIG. 1I is a schematic partial cross-sectional view of an anti-reflection layer in an optical structure layer according to an embodiment of FIG. 1A.

FIG. 1I is a schematic partial cross-sectional view of an anti-reflection layer in an optical structure layer according to an embodiment of FIG. 1A.

The anti-reflection layer 420 is, for example, disposed on the anti-glare layer 410. The anti-reflection layer 420 may be, for example, used for reducing the reflectivity of the ambient light from the outside to improve the quality of the image displayed by the display module 100a of the display device 10a, wherein reference may be, for example, made to FIG. 1I for the manner in which the anti-reflection layer 420 reduces the reflectivity of the ambient light from the outside. For example, when an ambient light L from the outside irradiates the anti-reflection layer 420, a first reflected light L1 reflected by the surface 420s of the anti-reflection layer 420 away from the display module 100a and a second reflected light L2 reflected by the anti-reflection layer 420 and an interface 420i between remaining film layers (for example, an interface between adjacent film layers in the anti-reflection layer 420 or an interface between the anti-reflection layer 420 and the anti-glare layer 410) are generated, wherein the first reflected light L1 and the second reflected light L2 have substantially opposite phases, so that destructive interference occurs between the first reflected light L1 and the second reflected light L2 to reduce the amplitude of the total reflected light reflected by the anti-reflection layer 420, so as to achieve the effect of reducing reflectivity. The anti-reflection layer 420 may, for example, be a laminate, wherein the laminate may, for example, include multiple high refractive index sub-layers 422 and multiple low refractive index sub-layers 424 stacked alternately, and the total number of the high refractive index sub-layers 422 and the low refractive index sub-layers 424 is, for example, greater than or equal to 4. For example, the anti-reflection layer 420 may, for example, include four film layers in which the high refractive index sub-layers 422 and the low refractive index sub-layers 424 overlap with each other; or the anti-reflection layer 420 may, for example, include ten film layers in which the high refractive index sub-layers 422 and the low refractive index sub-layers 424 overlap with each other, but the disclosure is not limited thereto. The high refractive index sub-layer 422 and the low refractive index sub-layer 424 included in the anti-reflection layer 420 may be formed by, for example, physical vapor deposition, such as vapor deposition, ion plating, sputter plating, or other suitable methods, but the disclosure is not limited thereto. In some embodiments, the material of the high refractive index sub-layer 422 may include indium tin oxide (ITO), but the disclosure is not limited thereto. In some other embodiments, the material of the high refractive index sub-layer 422 may include $Nb_2O_5$, other suitable oxides, or a combination thereof, and the remaining oxides may be, for example, $TiO_2$, $ZrO_2$, and $Ta_2O_5$, but the disclosure is not limited thereto. In some embodiments, the thickness of a single high refractive index sub-layer 422 is between 1 nm and 500 nm or between 1 nm and 300 nm. In some embodiments, the material of the low refractive index sub-layer 424 may include $SiO_2$, but the disclosure is not limited thereto. In some other embodiments, the material of the low refractive index sub-layer 424 may include fumed silica. In some embodiments, the thickness of a single low refractive index sub-layer 424 is between 1 nm and 500 nm or between 1 nm and 300 nm. In addition, in some embodiments, the high refractive index sub-layer 422 has an extinction coefficient (k) of between 0.01 and 0.05 (0.01≤k≤0.05), so that the anti-reflection layer 420 can produce a smoke-like effect.

The number of layers, the materials, and the thicknesses of the high refractive index sub-layer 422 and the low refractive index sub-layer 424 in the anti-reflection layer 420 are exemplified in Table 2 and Table 3 below, but the disclosure is not limited thereto. In Table 2, the stacking order of the high refractive index sub-layers 422 and the low refractive index sub-layers 424 from top to bottom is a first low refractive index sub-layer, a first high refractive index sub-layer, a second low refractive index sub-layer, and a second high refractive index sub-layer. In Table 3, the stacking order of the high refractive index sub-layers 422 and the low refractive index sub-layers 424 from top to bottom is the first low refractive index sub-layer, the first high refractive index sub-layer, the second low refractive index sub-layer, the second high refractive index sub-layer, a third low refractive index sub-layer, a third high refractive index sub-layer, a fourth low refractive index sub-layer, a fourth high refractive index sub-layer, a fifth low refractive index sub-layer, and a fifth high refractive index sub-layer.

TABLE 2

The material of the high refractive index sub-layer 422 includes $Nb_2O_5$, and the material of the low refractive index sub-layer 424 includes $SiO_2$.

|  | Thickness (nm) |
| --- | --- |
| First low refractive index sub-layer | 86.7 |
| First high refractive index sub-layer | 110.5 |
| Second low refractive index sub-layer | 36.0 |
| Second high refractive index sub-layer | 11.7 |

TABLE 3

The material of the high refractive index sub-layer 422 includes ITO, and the material of the low refractive index sub-layer 424 includes $SiO_2$.

|  | Thickness (nm) |
| --- | --- |
| First low refractive index sub-layer | 84.2 |
| First high refractive index sub-layer | 72.09 |
| Second low refractive index sub-layer | 14.14 |
| Second high refractive index sub-layer | 25.73 |
| Third low refractive index sub-layer | 134.55 |
| Third high refractive index sub-layer | 15.07 |
| Fourth low refractive index sub-layer | 27.56 |
| Fourth high refractive index sub-layer | 259.91 |
| Fifth low refractive index sub-layer | 24.96 |
| Fifth high refractive index sub-layer | 21.47 |

In the embodiment, the glossiness of the optical structure layer 400 is between 4 GU and 35 GU (4 GU≤the glossiness of the optical structure layer 400≤35 GU). For example, the glossiness of the optical structure layer 400 may be between 4 GU and 30 GU (4 GU≤the glossiness of the optical structure layer 400≤30 GU) or may be between 4 GU and 20 GU (4 GU≤the glossiness of the optical structure layer 400≤20 GU), but the disclosure is not limited thereto. The glossiness of the optical structure layer 400 may be, for example, measured at an angle of 60° using BYK-4446 and obtained using JIS Z8741 glossiness standard, but the disclosure is not limited thereto. In some other embodiments, the glossiness of the optical structure layer 400 may be measured at an angle of 20° or an angle of 85°.

In the embodiment, the reflectivity of specular component included (SCI) of the optical structure layer 400 may be between 3% and 6% (3%≤the reflectivity of SCI of the optical structure layer 400≤6%). For example, the reflectivity of SCI of the optical structure layer 400 may be between 4% and 6% (4%≤the reflectivity of SCI of the optical structure layer 400≤6%), but the disclosure is not limited thereto. The reflectivity of SCI of the optical structure layer 400 may be, for example, obtained by measuring using Konica-Minolta CM-3600-d under the waveband of visible light, but the disclosure is not limited thereto. For example, the reflectivity of SCI of the optical structure layer 400 may be obtained by measuring under light with a wavelength of 550 nm.

In the embodiment, the transmittance of the optical structure layer 400 is between 70% and 98% (70%≤the transmittance of the optical structure layer 400≤98%). For example, the transmittance of the optical structure layer 400 may be between 70% and 95% (70%≤the transmittance of the optical structure layer 400≤95%), but the disclosure is not limited thereto. Based on this, the optical structure layer 400 of the embodiment can provide relatively good light transmittance. The transmittance of the optical structure layer 400 may be, for example, obtained by measuring using BYK-4725 under the waveband of visible light, but the disclosure is not limited thereto. For example, the transmittance of the optical structure layer 400 may be obtained by measuring under light with a wavelength of 550 nm.

In the embodiment, through the optical structure layer 400 disposed on the display module 100a having the above structure, the glossiness of the display module 100a may be less than 5 GU, and the reflectivity of SCI of the display module 100a may be less than 3%. In addition, in the embodiment, the ratio of the reflectivity of specular component excluded (SCE) to the reflectivity of SCI of the display module 100a may be greater than 0.6 and less than 1 (0.6≤SCE of the display module 100a/SCI of the display module 100a≤1). The reflectivity of SCE of the display module 100a may be, for example, obtained by measuring using Konica-Minolta CM-3600-d under the waveband of visible light, but the disclosure is not limited thereto. For example, the reflectivity of SCE of the display module 100a may be obtained by measuring under light with a wavelength of 550 nm. It should be noted that the measurement manner of the glossiness and SCI of the display module 100a may be, for example, the same as or similar to the measurement manner of the glossiness and SCI of the optical structure layer 400, which will not be repeated here.

Based on this, through disposing the optical structure layer 400 on the display module 100a, the display module 100a of the display device 10a of the embodiment can have relatively good anti-glare performance, which can effectively scatter the ambient light from the outside to reduce the effect of reflection of the ambient light from the outside when the user views the display module 100a of the display device 10a, so as to improve the display quality of the display module 100a of the display device 10a. Based on this, when the user views an electronic device (for example, a digital gallery, a mobile phone, a tablet computer, a public information display, or other suitable electronic devices) including the display device 10a of the embodiment, the user may experience the image displayed by the electronic device as a piece of paper.

Figure 2:
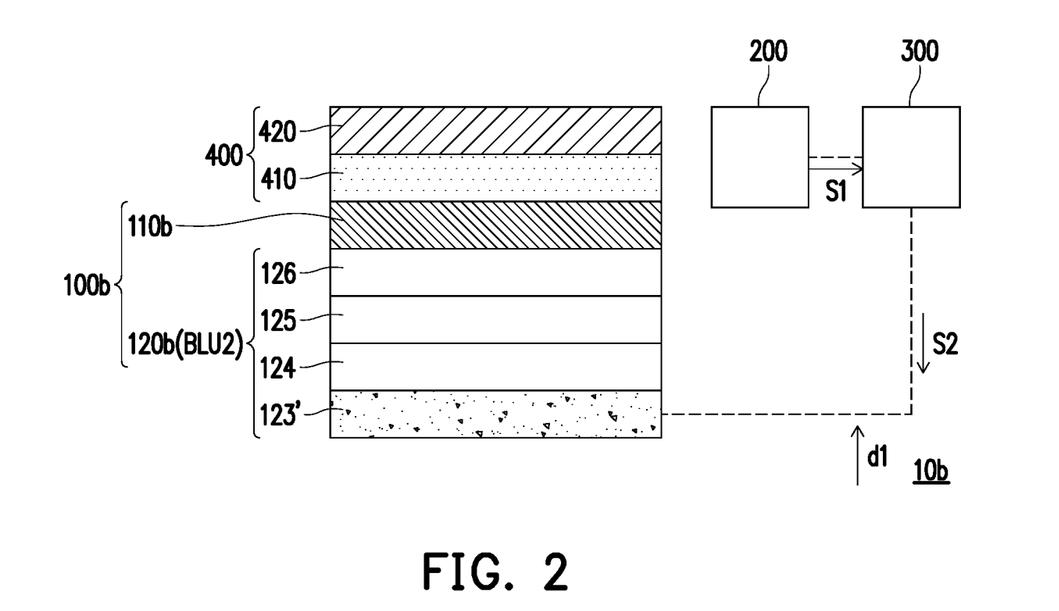
FIG. 2 is a schematic cross-sectional view of a display device according to a second embodiment of the disclosure.

FIG. 2 is a schematic cross-sectional view of a display device according to a second embodiment of the disclosure. It should be noted that the embodiment of FIG. 2 may continue to use the reference numerals and some content of the embodiment of FIG. 1A, wherein the same or similar reference numerals are adopted to indicate the same or similar elements, and the description of the same technical content is omitted.

Please refer to FIG. 2. The main difference between a display device 10b of the embodiment and the display device 10a is that a light emitting module 120b in a display module 100b of the display device 10b includes a direct-type light source instead of the monochrome liquid crystal panel Mono.

In detail, in the light emitting module 120b, a light source 123' included in a backlight unit BLU2 is the direct-type light source. In some embodiments, the light source 123' may include multiple light emitting diodes, wherein the driving manner of the light emitting diodes may include passive matrix addressing, active matrix addressing, or control by an integrated circuit, but the disclosure is not limited thereto. In the driving manner of passive matrix addressing, the light emitting diodes are arranged in an array and are electrically connected to a driving circuit, wherein each light emitting diode may be, for example, provided with signals to emit light by two mutually perpendicular signal lines in the driving circuit. In the driving manner of active matrix addressing, the light emitting diodes are arranged in an array and are respectively electrically connected to an independent driving circuit, wherein each light emitting diode may be, for example, provided with a signal to emit light by a transistor in the driving circuit. In the driving manner of control by the integrated circuit, the light emitting diodes are arranged in an array and are respectively controlled to emit light by the integrated circuit. Based on this, the light emitting module 120b can achieve finer local dimming.

Figure 3A:
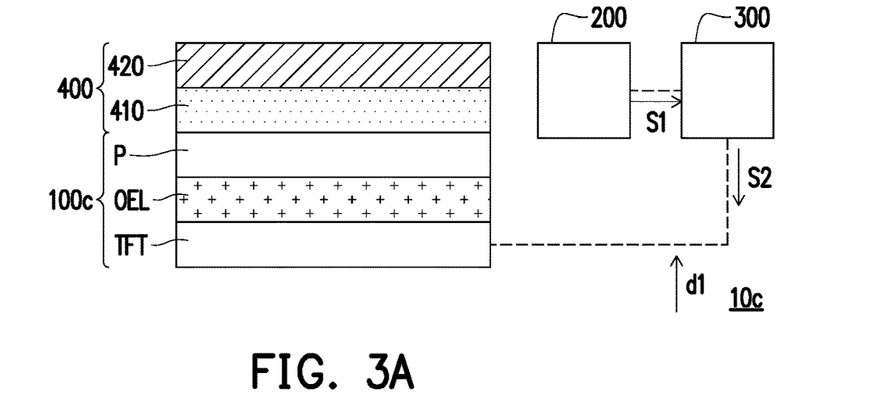
FIG. 3A is a schematic cross-sectional view of a display device according to a third embodiment of the disclosure.

FIG. 3A is a schematic cross-sectional view of a display device according to a third embodiment of the disclosure. It should be noted that the embodiment of FIG. 3A may continue to use the reference numerals and some content of the embodiment of FIG. 1A, wherein the same or similar reference numerals are adopted to indicate the same or similar elements, and the description of the same technical content is omitted.

Please refer to FIG. 3A. The main difference between a display device 10c of the embodiment and the display device 10a is that a display module 100c of the display device 10c is an organic light emitting diode display module.

In the embodiment, the display module 100c may include an active element array substrate TFT, an organic light emitting layer OEL, and a polarizing layer P, wherein the active element array substrate TFT, the organic light emitting layer ET, and the polarizing layer P are, for example, stacked in the first direction d1 in this order. In some embodiments, the display module 100c may further include a color filter (not shown) disposed on the organic light emitting layer OEL, but the disclosure is not limited thereto.

Figure 3B:
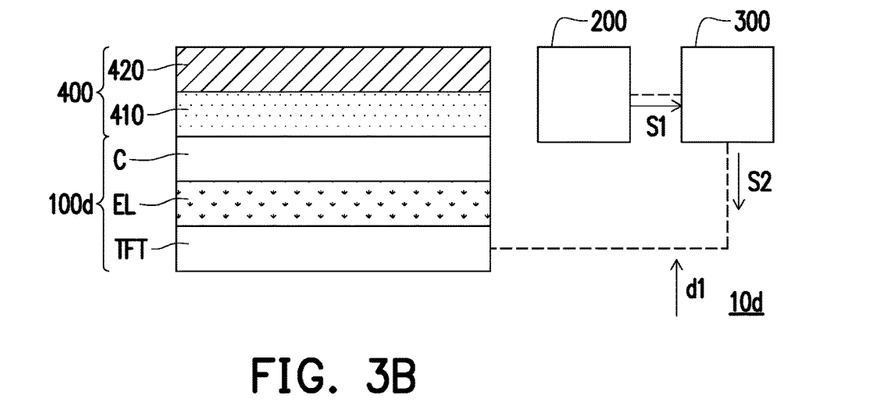
FIG. 3B is a schematic cross-sectional view of a display device according to a fourth embodiment of the disclosure.

FIG. 3B is a schematic cross-sectional view of a display device according to a fourth embodiment of the disclosure. It should be noted that the embodiment of FIG. 3B may continue to use the reference numerals and some content of the embodiment of FIG. 1A, wherein the same or similar reference numerals are adopted to indicate the same or similar elements, and the description of the same technical content is omitted.

Please refer to FIG. 3B. The main difference between a display device 10d of the embodiment and the display device 10a is that a display module 100d of the display device 10d is a micro light emitting diode display module or a mini light emitting diode display module.

In the embodiment, the display module 100d may include the active element array substrate TFT, a light emitting layer EL, and a filter layer C, wherein the active element array substrate TFT, the light emitting layer EL, and the filter layer C are, for example, stacked in the first direction d1 in this order. In some embodiments, the light emitting layer EL may include a mini light emitting diode or a micro light emitting diode, and the filter layer C may include a color filter layer or a quantum dot color filter layer, but the disclosure is not limited thereto.

Figure 4:
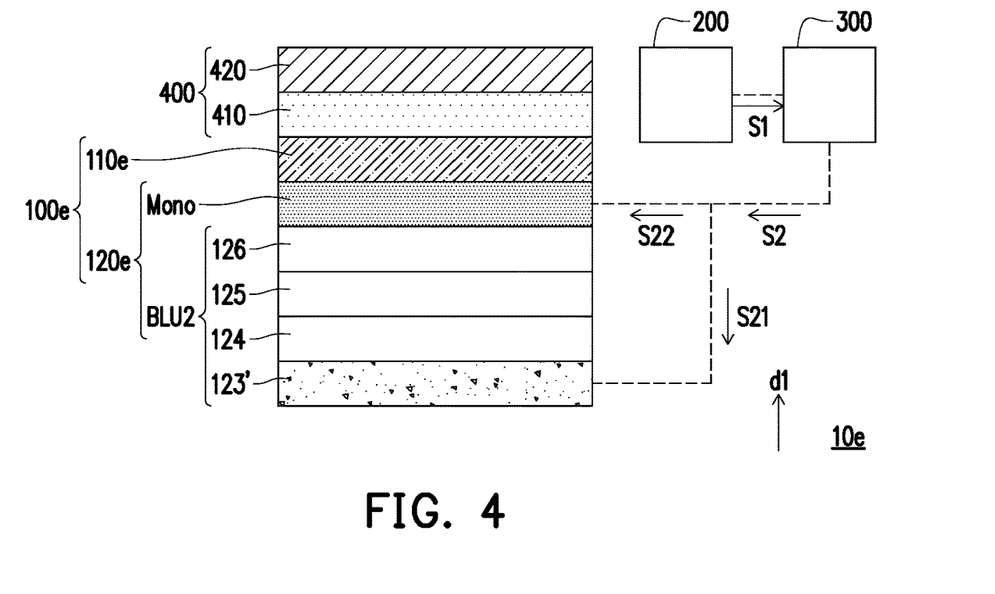
FIG. 4 is a schematic cross-sectional view of a display device according to a fifth embodiment of the disclosure.

FIG. 4 is a schematic cross-sectional view of a display device according to a fifth embodiment of the disclosure. It should be noted that the embodiment of FIG. 4 may continue to use the reference numerals and some content of the embodiment of FIG. 2, wherein the same or similar reference numerals are adopted to indicate the same or similar elements, and the description of the same technical content is omitted.

Please refer to FIG. 4. The main difference between a display device 10e of the embodiment and the display device 10b is that a light emitting module 120e in a display module 100e includes the monochrome liquid crystal panel Mono.

In the embodiment, through the light emitting module 120e including a combination of the monochrome liquid crystal panel Mono and the light source 123' (direct-type light source), the light emitting module 120e can achieve finer local dimming, and can improve the overall contrast of the image displayed by the display module 100e.

Figure 5:
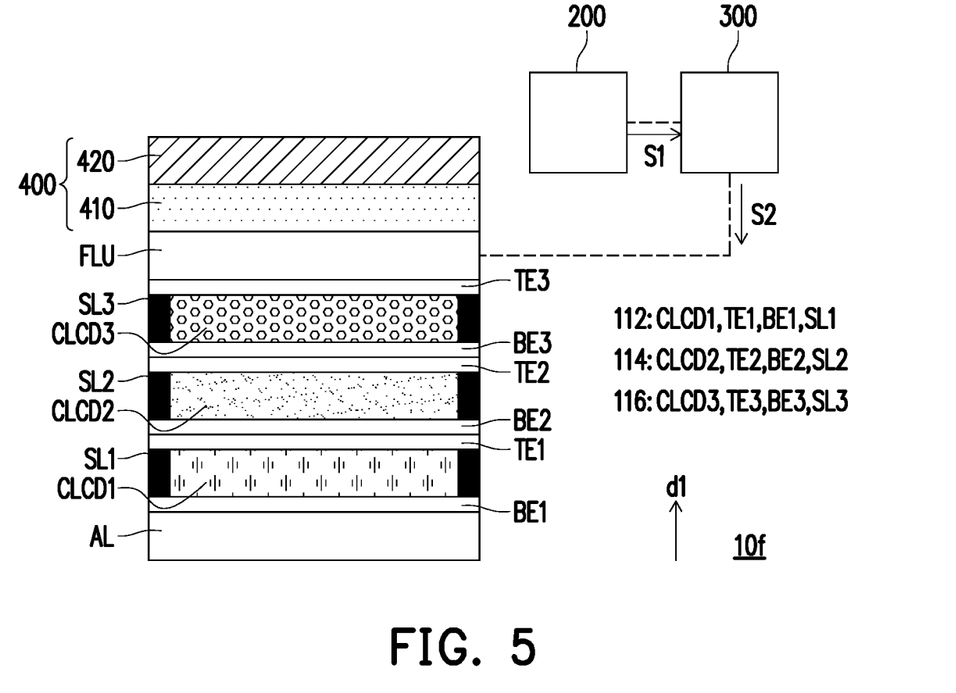
FIG. 5 is a schematic cross-sectional view of a display device according to a sixth embodiment of the disclosure.

FIG. 5 is a schematic cross-sectional view of a display device according to a sixth embodiment of the disclosure. It should be noted that the embodiment of FIG. 5 may continue to use the reference numerals and some content of the embodiment of FIG. 1A, wherein the same or similar reference numerals are adopted to indicate the same or similar elements, and the description of the same technical content is omitted.

Please refer to FIG. 5. The main difference between a display device 10f of the embodiment and the display device 10a is that a light emitting module 120f in the display device 10f is disposed between the optical structure layer 400 and a display panel.

In detail, in the embodiment, the light emitting module 120f includes a display panel 110f and a front light module FLU, wherein the display panel 110f is a reflective liquid crystal display panel, and the front light module FLU may include a light guide plate (not shown), a side-type light source (not shown), and other suitable components for the purpose of assisting the display panel 110f to display the image. For example, when the outside ambient light is relatively bright, the processor 300 may output the command signal S2 to the display module 100f after receiving the sensing signal S1 from the photodetector 200, so that the front light module FLU in the display module 100f correspondingly reduces the brightness of emitted light. In contrast, when the outside ambient light is relatively dim, the processor 300 may output the command signal S2 to the display module 100f after receiving the sensing signal S1 from the photodetector 200, so that the front light module FLU in the display module 100f correspondingly increases the brightness of the emitted light.

In the embodiment, the display panel 110f is a cholesteric liquid crystal display panel, but the disclosure is not limited thereto. The display panel 110f may, for example, include a light absorbing layer AL, a first cholesteric liquid crystal module 112, a second cholesteric liquid crystal module 114, and a third cholesteric liquid crystal module 116, wherein the light absorbing layer AL, the first cholesteric liquid crystal module 112, the second cholesteric liquid crystal module, 114 and the third cholesteric liquid crystal module 116 are, for example, stacked in the first direction dl in this order.

The light absorbing layer AL may be, for example, used for absorbing light not reflected by the first cholesteric liquid crystal module 112, the second cholesteric liquid crystal module 114, and the third cholesteric liquid crystal module 116, so as to improve the contrast of the image displayed by the display device 10f. In some embodiments, the material of the light absorbing layer AL may include a photoresist material or ink.

The first cholesteric liquid crystal module 112 includes, for example, a first cholesteric liquid crystal layer CLCD1, an upper electrode TE1, a lower electrode BE1, and a sealant SL1. The first cholesteric liquid crystal layer CLCD1 may be, for example, used for reflecting a first light with a first wavelength range, wherein the first light may be, for example, red light, but the disclosure is not limited thereto. The upper electrode TE1 and the lower electrode BE1 are, for example, respectively disposed on opposite sides of the first cholesteric liquid crystal layer CLCD1, so the arrangement of liquid crystal molecules in the first cholesteric liquid crystal layer CLCD1 may be changed through applying different voltages to the upper electrode TE1 and the lower electrode BE1 to generate a voltage difference, so that the first cholesteric liquid crystal layer CLCD1 may reflect the first light with the first wavelength range. The sealant SL1 may be, for example, disposed between the upper electrode TE1 and the lower electrode BE1, and may, for example, surround the first cholesteric liquid crystal layer CLCD1 to reduce the possibility of the first cholesteric liquid crystal layer CLCD1 flowing out.

The second cholesteric liquid crystal module 114 includes, for example, a second cholesteric liquid crystal layer CLCD2, an upper electrode TE2, a lower electrode BE2, and a sealant SL2. The second cholesteric liquid crystal layer CLCD2 may be, for example, used for reflecting a second light with a second wavelength range, wherein the second light may be, for example, green light, but the disclosure is not limited thereto. The upper electrode TE2, the lower electrode BE2, and the sealant SL2 may be respectively the same as or similar to the upper electrode TE1, the lower electrode BE1, and the sealant SL1, which will not be repeated here.

The third cholesteric liquid crystal module 116 includes, for example, a third cholesteric liquid crystal layer CLCD3, an upper electrode TE3, a lower electrode BE3, and a sealant SL3. The third cholesteric liquid crystal layer CLCD3 may be, for example, used for reflecting a third light with a third wavelength range, wherein the third light may be, for example, blue light, but the disclosure is not limited thereto. The upper electrode TE3, the lower electrode BE3, and the sealant SL3 may be respectively the same as or similar to the upper electrode TE1, the lower electrode BE1, and the sealant SL1, which will not be repeated here.

Figure 6:
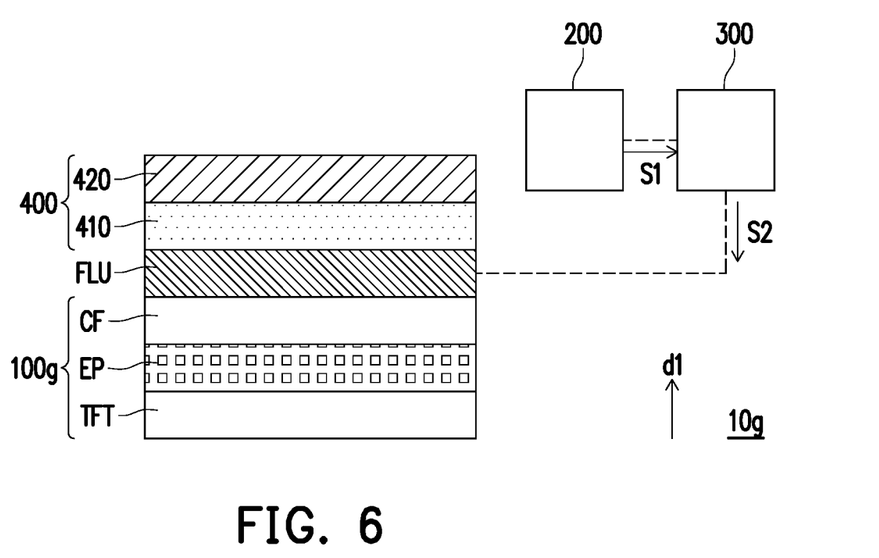
FIG. 6 is a schematic cross-sectional view of a display device according to a seventh embodiment of the disclosure.

FIG. 6 is a schematic cross-sectional view of a display device according to a seventh embodiment of the disclosure. It should be noted that the embodiment of FIG. 6 may continue to use the reference numerals and some content of the embodiment of FIG. 5, wherein the same or similar reference numerals are adopted to indicate the same or similar elements, and the description of the same technical content is omitted.

Please refer to FIG. 6. The main difference between a display device 10g of the embodiment and the display device 10f is that the display panel 110g is an electrophoretic display panel.

In the embodiment, the display panel 110g may include the active element array substrate TFT, an electrophoretic layer EP, and a color filter substrate CF, wherein the active element array substrate TFT, the electrophoretic layer EP, and the color filter substrate CF are, for example, stacked in the first direction dl in this order. The electrophoretic layer EP may, for example, include multiple charged particles (not shown) and a fluid (not shown), wherein the charged particles may be dispersed in the fluid, but the disclosure is not limited thereto.

Figure 7A:
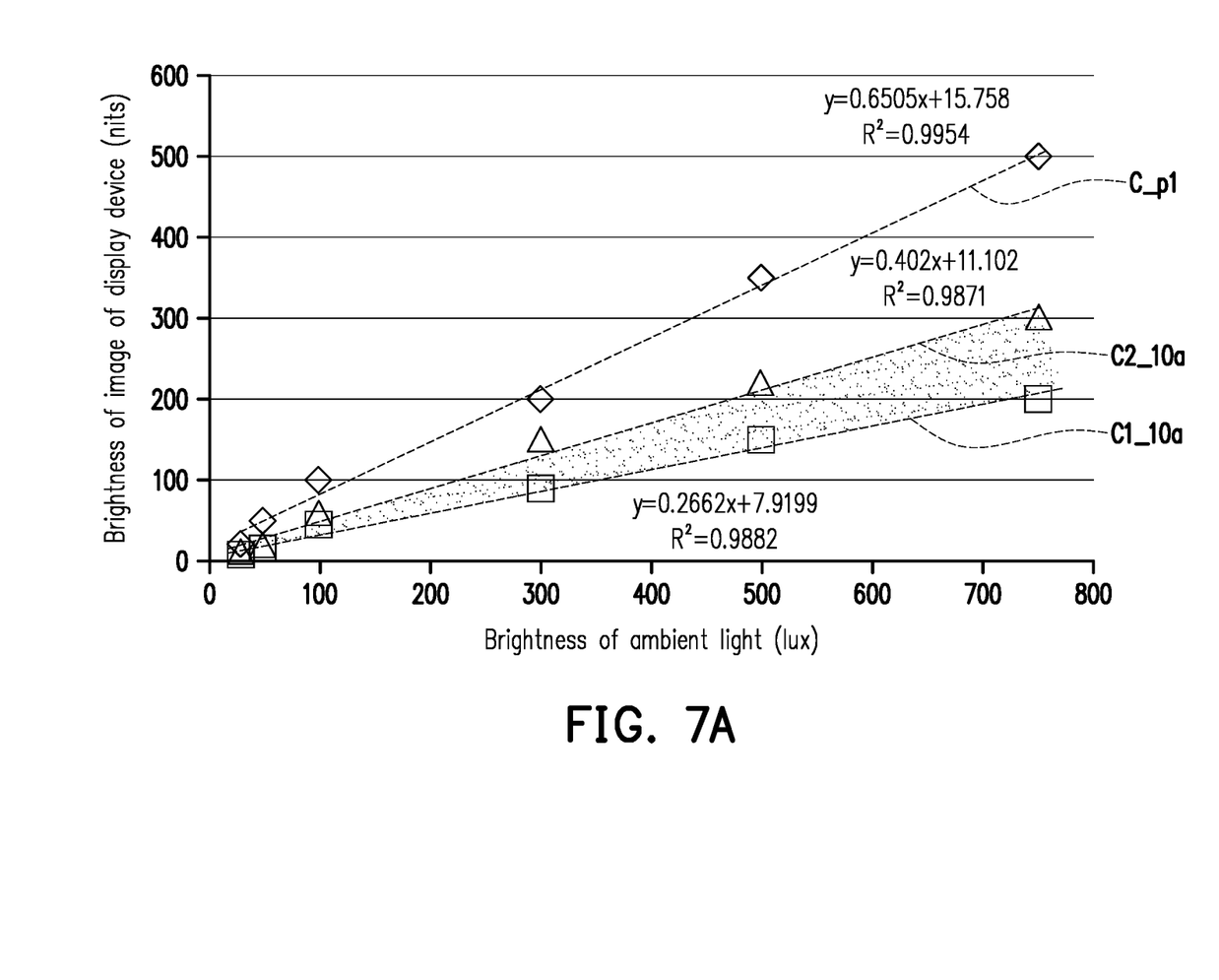
FIG. 7A is a graph of a relationship between brightness of image and brightness of ambient light of a display device according to an embodiment of the disclosure and a conventional display device.
Figure 7B:
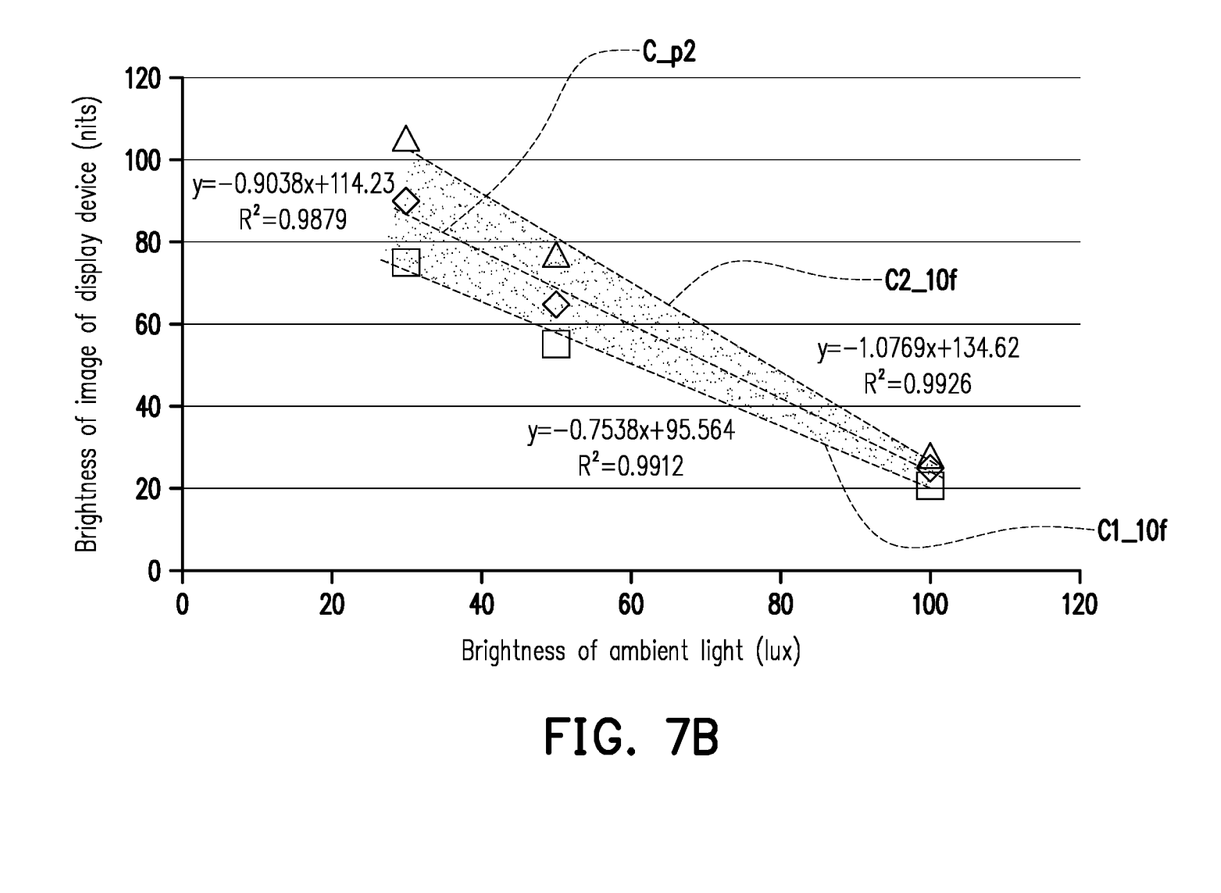
FIG. 7B is a graph of a relationship between brightness of image and brightness of ambient light of a display device according to another embodiment of the disclosure and a conventional display device.

FIG. 7A is a graph of a relationship between brightness of image and brightness of ambient light of a display device according to an embodiment of the disclosure and a conventional display device, and FIG. 7B is a graph of a relationship between brightness of image and brightness of ambient light of a display device according to another embodiment of the disclosure and a conventional display device.

Please refer to FIG. 7A. FIG. 7A shows relationship curves C1_10a and C2_10a of the brightness of the image of the display device 10a against the brightness of the ambient light (illuminance) and a relationship curve C_p1 of the brightness of the image of the conventional display device against the brightness of the ambient light, wherein light sources included in the display device 10a and the conventional display device come from backlight modules, so the brightness of the image increases as the brightness of the ambient light increases.

In the embodiment, the relationship between the brightness of the image of the display device 10a and the brightness of the ambient light satisfies the following Relational Expression 1: $y_1 = a_1 * x_1 + C_1$, where $y_1$ is the brightness of the image of the display device 10a, $x_1$ is the brightness of the ambient light, $C_1$ is a constant, and $a_1$ is the degree of change of the brightness of the image of the display device 10a due to the brightness of the ambient light. In the embodiment, $a_1$ is between 0.25 and 0.41 ($0.25 \leq a_1 \leq 0.41$). That is, when $a_1$ is in the above range, the display device 10a can still have good display quality under the ambient light with a specific brightness.

It can be seen from FIG. 7A that in the case of the same brightness of the ambient light, the brightness of light emission of the light emitting module 120a of the display device 10a is about 40% to 60% (a region defined between the relationship curve C1_10a and the relationship curve C2_10a as shown in FIG. 7A) of the brightness of light emission of the light emitting module of the conventional display device, that is, the brightness of light emission of the light emitting module 120a in the display device 10a is relatively low, which can reduce the electrical energy consumed by the display device 10a.

Please continue to refer to FIG. 7B. FIG. 7B shows relationship curves C1_10f and C2_10f of the brightness of the image of the display device 10f against the brightness of the ambient light and a relationship curve C_p2 of the brightness of the image of the conventional display device against the brightness of the ambient light, wherein the light sources included in the display device 10f and the conventional display device come from front light modules, so the brightness of the image decreases as the brightness of the ambient light increases. It is worth noting that when the brightness of the ambient light exceeds 100 lux, it is not necessary to use the auxiliary light source of the front light module.

In the embodiment, the relationship between the brightness of the image of the display device 10f and the brightness of the ambient light satisfies the following Relational Expression 2: $y_2=a_2*x_2+C_2$, where $y_2$ is the brightness of the image of the display device 10f, $x_2$ is the brightness of the ambient light, $C_2$ is a constant, and $a_2$ is the degree of change of the brightness of the image of the display device 10f due to the brightness of the ambient light. In the embodiment, $a_2$ is between −1.10 and −0.75 (−1.10≤$a_2$≤−0.75). That is, when $a_2$ is in the above range, the display device 10f can still have good display quality under the ambient light with a specific brightness.

It can be seen from FIG. 7B that in the case of the same brightness of the ambient light, the brightness of light emission of the light emitting module 120f of the display device 10f is about 80% to 120% (a region defined between the relationship curve C1_10f and the relationship curve C2_10f as shown in FIG. 7B) of the brightness of light emission of the light emitting module of the conventional display device, that is, the brightness of light emission of the light emitting module 120f in the display device 10f can be relatively low under specific circumstances, which can reduce the electrical energy consumed by the display device 10f.

In summary, through enabling the glossiness of the optical structure layer in the display device provided by the embodiments of the disclosure to be between 4 GU and 35 GU and the reflectivity of SCI of the optical structure layer to be between 3% and 6%, the display device of the embodiments of the disclosure can have relatively low glossiness and relatively low reflectivity of SCI, so as to improve the anti-glare performance of the display device of the embodiments of the disclosure to effectively scatter the ambient light from the outside. Based on this, the effect of reflection of the ambient light from the outside can be reduced when the user views the electronic device including the display device of the embodiments of the disclosure to experience the display device with high display quality.

Furthermore, the display device provided by the embodiments of the disclosure includes the photodetector for detecting the ambient light. Through correspondingly adjusting the brightness of the image of the display module in accordance with the brightness of the ambient light detected by the photodetector, the display quality of the display device can be improved.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments may still be modified or some or all of the technical features thereof may be equivalently replaced. However, the modifications or replacements do not cause the essence of the corresponding technical solutions to deviate from the scope of the technical solutions of the embodiments of the disclosure.

What is claimed is:

1. A display device, comprising:
    a display module, used for displaying an image;
    a photodetector, electrically connected to the display module and used for detecting brightness of an ambient light and outputting a sensing signal;
    a processor, electrically connected to the display module and the photodetector, and used for receiving the sensing signal and outputting a command signal to the display module according to the sensing signal, so that the display module adjusts brightness of the image according to the command signal; and
    an optical structure layer, disposed on the display module, wherein a glossiness of the optical structure layer is between 4 GU and 35 GU, and a reflectivity of specular component included (SCI) of the optical structure layer is between 3% and 6%.

2. The display device according to claim 1, wherein the display module comprises a display panel and a light emitting module, the light emitting module is used for providing a light to the display panel, and the light emitting module adjusts brightness of the light according to the command signal.

3. The display device according to claim 2, wherein a difference between an angle of a viewing angle corresponding to half of an intensity of the light and an angle of a center viewing angle is greater than 40 degrees.

4. The display device according to claim 2, wherein the light emitting module comprises an upper diffusion sheet and a lower diffusion sheet, and the upper diffusion sheet is directly disposed on the lower diffusion sheet.

5. The display device according to claim 4, wherein the light emitting module further comprises a dual brightness enhancement film, and the dual brightness enhancement film is disposed on the upper diffusion sheet.

6. The display device according to claim 2, wherein the display panel is disposed between the optical structure layer and the light emitting module, and the display panel comprises a liquid crystal panel and a color filter layer.

7. The display device according to claim 6, wherein a relationship between the brightness of the image of the display device and the brightness of the ambient light satisfies a following relational expression:

$$y_1=a_1*x_1+C_1, \qquad \text{Relational Expression 1:}$$

where $y_1$ is the brightness of the image of the display device, $x_1$ is the brightness of the ambient light, $C_1$ is a constant, and $a_1$ is a degree of change of the brightness of the image of the display device due to the brightness of the ambient light, wherein $a_1$ is between 0.25 and 0.41.

8. The display device according to claim 2, wherein the light emitting module is disposed between the optical structure layer and the display panel, and the display panel comprises a cholesteric liquid crystal display panel or an electrophoretic display panel.

9. The display device according to claim 8, wherein a relationship between the brightness of the image of the display device and the brightness of the ambient light satisfies a following relational expression:

$$y_2=a_2*x_2+C_2, \qquad \text{Relational Expression 2:}$$

where $y_2$ is the brightness of the image of the display device, $x_2$ is the brightness of the ambient light, $C_2$ is a constant, and $a_2$ is a degree of change of the brightness of the image of the display device due to the brightness of the ambient light, wherein $a_2$ is between −1.10 and −0.75.

10. The display device according to claim 2, wherein the light emitting module further comprises a backlight unit and a monochrome liquid crystal panel, and the monochrome liquid crystal panel is disposed between the backlight unit and the display panel.

11. The display device according to claim 1, wherein the display module is an organic light emitting diode display module, a micro light emitting diode display module, or a mini light emitting diode display module.

12. The display device according to claim 1, wherein the glossiness of the optical structure layer is further between 4 GU and 30 GU.

13. The display device according to claim 12, wherein the glossiness of the optical structure layer is further between 4 GU and 20 GU.

14. The display device according to claim 1, wherein a transmittance of the optical structure layer is between 70% and 98%.

15. The display device according to claim 14, wherein the transmittance of the optical structure layer is further between 70% and 95%.

16. The display device according to claim 1, wherein the reflectivity of SCI of the optical structure layer is further between 4% and 6%.

17. The display device according to claim 1, wherein the optical structure layer comprises an anti-glare layer and an anti-reflection layer, wherein the anti-reflection layer is disposed on the anti-glare layer.

18. The display device according to claim 17, wherein the anti-reflection layer comprises a plurality of high refractive index sub-layers and a plurality of low refractive index sub-layers stacked alternately.

19. A display device, comprising:
   a display module;
   a light emitting module, comprising a plurality of independently controllable light emitting regions and used for emitting a light toward the display module; and
   an optical structure layer, disposed on the display module,
   wherein a glossiness of the optical structure layer is between 4 GU and 35 GU, and a reflectivity of SCI of the optical structure layer is between 3% and 6%.

20. The display device according to claim 19, wherein the light emitting module further comprises a backlight unit and a monochrome liquid crystal panel, and the monochrome liquid crystal panel is disposed between the backlight unit and the display panel.

* * * * *